United States Patent
Chikama et al.

(10) Patent No.: US 6,518,676 B2
(45) Date of Patent: Feb. 11, 2003

(54) METAL INTERCONNECTIONS AND ACTIVE MATRIX SUBSTRATE USING THE SAME

(75) Inventors: Yoshimasa Chikama, Souraku-gun (JP); Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/866,121

(22) Filed: May 25, 2001

(65) Prior Publication Data

US 2002/0003048 A1 Jan. 10, 2002

(30) Foreign Application Priority Data

Apr. 2, 2001 (JP) .......................... 2001-103337
May 25, 2001 (JP) .......................... 2000-155005

(51) Int. Cl.$^7$ .......................... H01L 23/522
(52) U.S. Cl. .................. 257/775; 257/773; 349/139
(58) Field of Search ................. 257/773, 775; 349/139

(56) References Cited

U.S. PATENT DOCUMENTS

| 4,154,877 A | 5/1979 | Vratny | 106/1.26 |
| 5,693,983 A | 12/1997 | Ho et al. | 257/763 |
| 5,788,854 A | 8/1998 | Desaigoudar et al. | 216/13 |
| 6,030,877 A | 2/2000 | Lee et al. | 257/295 |
| 2002/0060323 A1 | 5/2002 | Jeong et al. | 257/91 |

FOREIGN PATENT DOCUMENTS

| JP | 4232922 | 8/1992 | |
| JP | 10-321622 | 12/1998 | |
| JP | 2000-266896 A | 3/2000 | C23F/1/00 |
| JP | 420853 | 2/2001 | H01L/21/60 |
| WO | WO 00/03571 | 1/2000 | H05K/3/40 |

OTHER PUBLICATIONS

U.S. application Ser. No. 09/795,832, Filed Feb. 28, 2001, Yoshihiro Izumi, et al., for Metal Line, Method for Fabricating the Metal Line, Thin Film Transistor Employing the Metal Line and Display Device.

Low Resistance Copper Address Line for TFT–LCD, M. Ikeda, M. Ogawa, K. Suzuki; Toshiba R&D Center, Kawasaki; Japan Display 1989, pp. 498–501.

Primary Examiner—Allan R. Wilson
(74) Attorney, Agent, or Firm—Edwards & Angell, LLP; David G. Conlin; Richard J. Roos

(57) ABSTRACT

A ground pattern film 12 for interconnections is formed on a glass substrate 11, and a plating film 13 is formed by selective plating on the ground pattern film 12. A taper angle $\alpha$ which both sides of the plating film 13 form with the surface of the glass substrate 11 is made in the range of $0 < \alpha < 90°$. This arrangement allows the formation of new metal lines on the plating film 13 without a break and allows the patterning of a new film on the plating film 13 without a remaining film.

8 Claims, 8 Drawing Sheets

| | | |
|---|---|---|
| $\alpha$ | TAPER ANGLE OF METAL LINES (PLATING FILM) | 0~90° |
| $\beta$ | TAPER ANGLE OF GROUND PATTERN FILM | 0~90° |
| X | THICKNESS OF PLATING FILM | NOT SMALLER THAN DIGGING QUANTITY OF GLASS 8000Å |
| Y | DIGGING QUANTITY OF GLASS | 0~2000Å |

| α | TAPER ANGLE OF METAL LINES (PLATING FILM) | 0~90° |
| --- | --- | --- |
| β | TAPER ANGLE OF GROUND PATTERN FILM | 0~90° |
| X | THICKNESS OF PLATING FILM | NOT SMALLER THAN DIGGING QUANTITY OF GLASS 8000Å |
| Y | DIGGING QUANTITY OF GLASS | 0~2000Å |

FIRST PROCESS

SECOND PROCESS

Fig.3

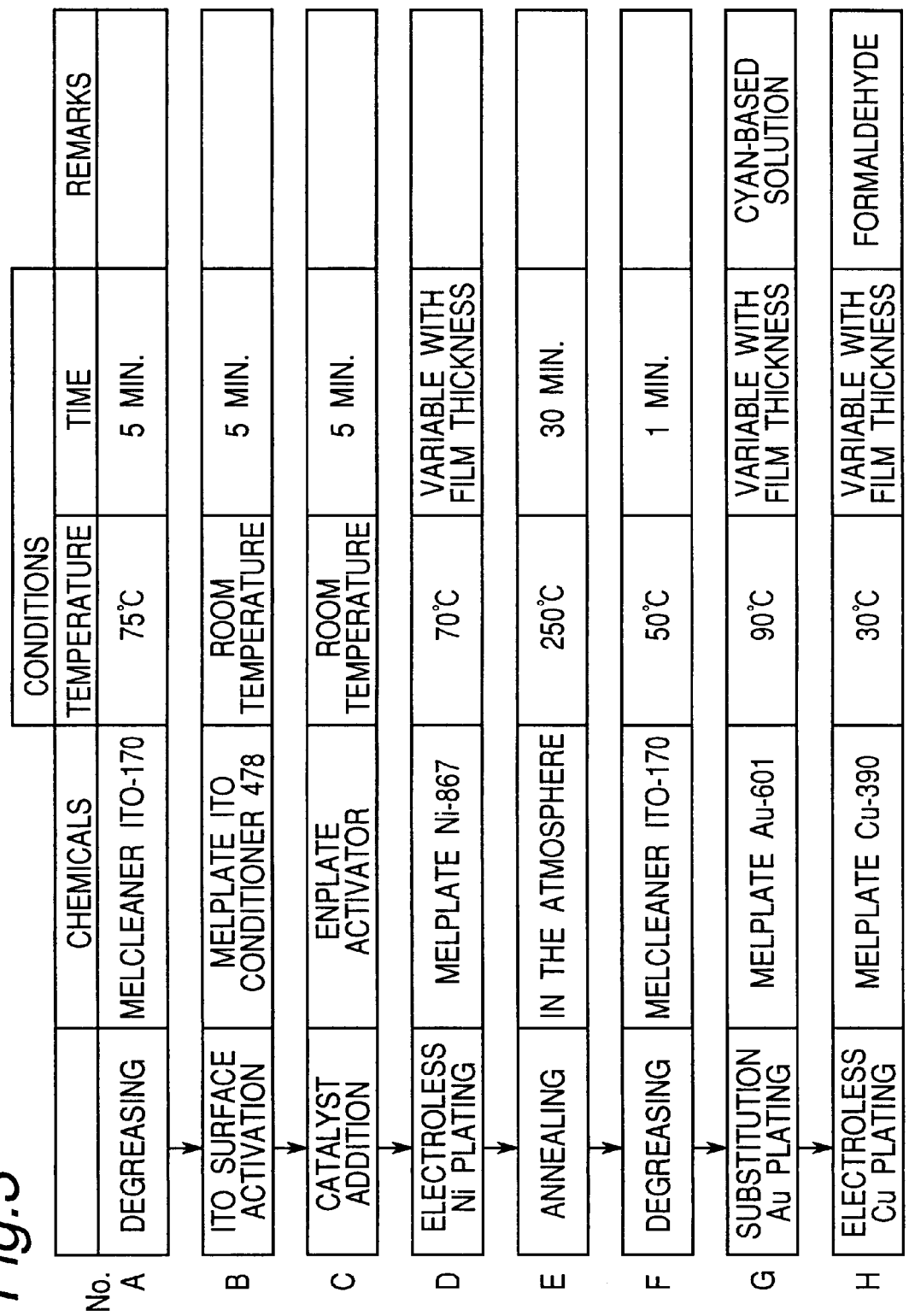

| No. | | CHEMICALS | CONDITIONS | | REMARKS |
|---|---|---|---|---|---|
| | | | TEMPERATURE | TIME | |
| A | DEGREASING | MELCLEANER ITO-170 | 75°C | 5 MIN. | |
| B | ITO SURFACE ACTIVATION | MELPLATE ITO CONDITIONER 478 | ROOM TEMPERATURE | 5 MIN. | |
| C | CATALYST ADDITION | ENPLATE ACTIVATOR | ROOM TEMPERATURE | 5 MIN. | |
| D | ELECTROLESS Ni PLATING | MELPLATE Ni-867 | 70°C | VARIABLE WITH FILM THICKNESS | |
| E | ANNEALING | IN THE ATMOSPHERE | 250°C | 30 MIN. | |
| F | DEGREASING | MELCLEANER ITO-170 | 50°C | 1 MIN. | |
| G | SUBSTITUTION Au PLATING | MELPLATE Au-601 | 90°C | VARIABLE WITH FILM THICKNESS | CYAN-BASED SOLUTION |
| H | ELECTROLESS Cu PLATING | MELPLATE Cu-390 | 30°C | VARIABLE WITH FILM THICKNESS | FORMALDEHYDE |

METAL INTERCONNECTIONS AND ACTIVE MATRIX SUBSTRATE USING THE SAME

BACKGROUND OF THE INVENTION

The present invention relates to metal interconnections and an active matrix substrate using the metal interconnections, for use in flat panel displays such as liquid crystal displays (LCD), plasma display panels (PDP), electrochromic displays (ECD) and electroluminescent displays (ELD), printed wiring boards using ceramic plate boards, and other various fields.

In a flat panel display typified by liquid crystal display (LCD), display material such as liquid crystal and discharge gas are enclosed and held between a pair of substrates, conventionally, and display operation is performed by applying a voltage to the display material. In this structure, electrical wiring that comprises conductive material is arranged on at least one of the substrates.

In an active matrix driving display, for example, a matrix pattern of gate electrodes and data electrodes is provided on one (an active matrix substrate) of a pair of substrates that enclose and hold display material, and thin film transistors (TFTs) and pixel electrodes are provided at each intersection of the gate electrodes and the data electrodes. Conventionally, these gate electrodes and data electrodes are formed of metal material such as Ta, Al and Mo, and the electrodes are deposited with a dry deposition technique such as sputtering.

In an attempt to increase the area and definition of such a flat panel display, the delay of driving signal turns out to be a considerable problem because of the increase in the driving frequency and the increase in the resistance and parasitic capacity of the electrical wiring.

As an attempt to solve the problem of the delay of driving signal, Cu having the lower electric resistance (bulk resistance of 1.7 $\mu\Omega\cdot$cm) has been used as interconnecting material, in place of conventional interconnecting materials, i.e., Al (having bulk resistance of 2.7 $\mu\Omega\cdot$cm), $\alpha$-Ta (having bulk resistance of 13.1 $\mu\Omega\cdot$cm) and Mo (having bulk resistance of 5.8 $\mu\Omega\cdot$cm). For example, the result of the study on a TFT-LCD utilizing Cu as the material of the gate electrode has been disclosed in a literature "Low Resistance Copper Address Line for TFT-LCD" (Japan Display '89, p.498–501). In the literature is specified that a Cu film deposited with sputtering has a poor adhesion to a ground glass substrate and requires the interposition of a film of metal such as Ta on the ground in order to improve the adhesion.

The interconnecting structure disclosed in the literature requires each ground metal film such as Cu film and Ta to be individually subjected to a dry depositing process and an etching process, resulting in the increase in the number of processes and the rising of the cost.

In Japanese Patent Laid-open Publication HEI 04-232922 is proposed a method of using a transparent electrode that comprises ITO (indium tin oxide) or the like for a ground film and depositing a metal film such as Cu on the ground film with plating technique. As an effect described therein, this technique allows plating metal to be selectively deposited only on the ITO film and requires patterning process only for the ITO film of the transparent electrode and permits Cu interconnections with a large area to be deposited efficiently. There is also described a structure in which a metal film such as Ni with a satisfactory adhesion to ITO is interposed between ITO and Cu.

In Japanese Patent Laid-open Publication HEI 10-321622 is proposed a method of forming a reversely tapered resist on a ground metal and performing electroplating thereon and thereby forming a normally tapered film. For the definitions of "normal taper" and "reverse taper," as shown in FIG. 8, the case that a taper angle $\theta$ which both sides of a plating film 112 formed on a glass substrate 111 form with the surface of the glass substrate 111 is not greater than 90° is defined as "normal taper." As shown in FIG. 9, the case that a taper angle $\theta$ which both sides of a plating film 122 formed on a glass substrate 121 form with the surface of the glass substrate 121 is greater than 90° is defined as "reverse taper."

In the formation of the metal interconnections on the ground ITO film with plating technique as disclosed in the Japanese Patent Laid-open Publication HEI 04-232922, a pretreatment for plating is performed with chemicals based on HF (hydrogen fluoride) for the selectivity of metal film deposition on the glass and the ground ITO film and for the adhesion of the plating film to the ground film. (This treatment is performed for the elimination of catalyst adhering to the glass, in most cases, regardless of the type of the ground film, and is applied even to polyimide or the like.) In the deposition of a metal film with plating, or in the degreasing with alkaline solution for the elimination of dirt on the surface, or in the use of alkaline plating solution as in Cu plating, the glass surface not covered by ground pattern is etched by the reason proper to plating. The word "plating" used herein refers to electroless plating, electroplating and the like.

It also has been found that a plating film generates the part that rapidly grows and the part that slowly grows with the growth of the film.

In this manner, the glass surface not covered by the ground film may be etched and the formed film may be reversely tapered because of the difference in the growth rate of the film.

In the case that the plating film 122 is reversely tapered as shown in FIG. 9, the deposition of another film on the metal interconnections and the patterning on the metal interconnections present such problems as the following. In the deposition, masking by the reversely tapered part may prevent the film from being deposited properly in the edge part of the interconnecting lines, resulting in a step-wise disconnection caused by a film cracking in the edge part. Besides, in the etching process, masking by the metal lines may produce a remaining film in the edge part.

In the method of forming normally tapered metal lines by the formation of a resist, electroplating and ground etching as disclosed in the Japanese Patent Laid-Open Publication HEI 10-321622, a large substrate (a large glass) might cause large variations in the thickness of the film over its whole width because of the employment of electroplating. In the etching of the ground, even a volume of the ground film below the plating film may be etched to form a shape like an umbrella as shown in FIG. 10. (This influence is especially large in wet etch; however, even in dry etching, the ground film undergoes such an influence though smaller than in wet etching.)

SUMMARY OF THE INVENTION

An object of the present invention is to provide metal interconnections that prevent step-wise disconnections and remaining film and to provide an active matrix substrate using the same, by the deposition of a plating film with a satisfactory shape of taper on a ground pattern film.

In order to achieve the above object, there is provided metal interconnections which are formed on a glass substrate and comprise a ground pattern film for interconnecting lines and a plating film formed by selective plating on the ground pattern film, characterized in that a taper angle a which both sides of the plating film form with the surface of the glass substrate is in the range of $0<\alpha \leqq 90°$.

According to the metal interconnections with the above arrangement, the taper angle $\alpha$ which both sides of the plating film formed by selective plating on the ground pattern film form with the surface of the glass substrate is in the range of $0<\alpha \leqq 90°$. In the deposition and patterning of another film thereon, breaks and remaining film can be thereby prevented because the both sides of the plating film is not reversely tapered at least. As a result, in the formation of new metal lines on the metal interconnections, the new metal lines can be formed without a break. Besides, in the patterning of a new film on the metal interconnections, remaining film that would be caused by faulty etching of the edge parts of the metal interconnections can be prevented.

As the ground film, various types of films including metal, oxidized films such as ITO and organic films such as polyimide can be used as long as the films allow the deposition of the plating film.

In one embodiment of the present invention, a taper angle $\beta$ which both sides of the ground pattern film form with the surface of the glass substrate is in the range of $0<\beta \leqq 90°$ and a digging quantity Y of the glass substrate in an area that is not covered with the ground pattern film is in the range of $0 \leqq Y \leqq 2000$ Å and a thickness X of the plating film is in the range of $Y \leqq X \leqq 8000$ Å.

In the employment of electroless selective plating as the plating technique, for example, the surface of the glass substrate is etched for the selectivity between the glass substrate and the ground pattern film or for the adhesion of the plating film to the ground pattern film. This etching is wet etch and isotropic etching, and a large etching quantity on the glass therefore might involve etching a volume of the glass below both the sides of the ground pattern film and might shape both the sides like an umbrella. By plating on the ground pattern film with such a shape, a plating film with a satisfactory shape of taper cannot be obtained. For the minimum of the digging quantity of the glass substrate, the quantity is preferably zero if possible, in terms of the transparency of the glass, and the like. Too large thickness of the plating film might cause the taper of both sides of the plating film to get upright with the increase in the thickness, and its portions in intimate contact with the glass might be reversely tapered at last, because plating is basically isotropic deposition. Concerning the case that the thickness of the plating film is smallest, the film thinner than the digging quantity of glass can not cover etched portions of the glass and would result in an unsatisfactory shape of taper. It is therefore necessary for the film thickness to be greater than the digging quantity of glass. In the case that the taper angle which both sides of the ground pattern film form with the glass substrate is greater than 90°, i.e., in the case of reverse taper, the problem would arise that plating film to be formed on the ground pattern film would be reversely tapered as a matter of course.

From these reasons, a plating film with the taper angle $\alpha$ in the range of $0<\alpha \leqq 90°$ can be reliably formed without making the taper of both the sides reversed, in accordance with the metal interconnections of the above embodiment, with the arrangement in which the taper angle $\beta$ formed by both the sides of the ground pattern film with the surface of the glass substrate is in the range of $0<\beta \leqq 90°$, the digging quantity Y of the glass substrate in the area that is not covered with the ground pattern film is in the range of $0 \leqq Y \leqq 2000$ Å and the thickness X of the plating film is in the range of $Y \leqq X \leqq 8000$ Å.

In one embodiment of the present invention, the ground pattern film comprises ITO or $SnO_2$.

The metal interconnections of the above embodiment have a great advantage of being able to increase a margin for the manufacturing process because ITO is highly resistant to the chemicals used in the manufacturing process of active matrix substrates, for example, and $SnO_2$ is highly resistant to common chemicals. The methods of depositing ITO or $SnO_2$ include dry deposition such as sputtering and wet deposition (e.g., sol-gel processing, liquid growth, electrodeposition, spraying, and chemical mist deposition (CMD)). In the deposition of ITO or $SnO_2$ film with sol-gel processing of wet deposition, for example, photosensitive material can be employed. The employment of photosensitive material eliminates the use of resist and therefore results in cost reduction and the curtailment of the process.

In the application of the metal interconnections to an active matrix substrate, using a transparent conductive film of ITO or $SnO_2$ as the ground pattern film allows the simultaneous formation of the ground pattern film of the metal interconnections and pixel electrodes, and plating only the area of the interconnecting lines allows the simultaneous formation of the interconnecting lines and pixel electrodes.

In one embodiment of the present invention, the ground pattern film comprises polyimide.

In the metal interconnections of the above embodiment, Cu plating on polyimide has been put into practical use in printed circuit boards and the like. Polyimide is suitable as the ground pattern film, for example, in consideration of the employment of electroless selective plating as the plating technique. In comparison with other resins, polyimide has such advantages as the following:

(1) Polyimide holds superiority in the resistance to heat and chemicals among resins, and using polyimide as the ground resin therefore permits the method of manufacturing in subsequent-treatments to be selected from a wide variety of options. In the employment of electroless selective plating as plating technique, for example, high resistance to chemicals is useful because plating solution is strongly alkaline or strongly acid in most cases.

(2) Polyimide, having high resistance to heat, widens the margins of other deposition processes. For example, the maximal process temperature of conventional liquid crystal is on the order of 350° C., though the heat resistance of polyimide is on the order of 400° C. (Polyimide sets normally at a temperature on the order of 350° C. and its pyrolysis temperature is not lower than 450° C. in the majority of cases.) Accordingly, a low temperature in the processes is not required, in contrast to the employment of other resins. The fact that alterations to the processes are not required means the prevention of failures associated with the alterations and provides great advantages in the manufacturing of products. Incidentally, the temperatures indicating heat resistance of other resins are on the order of 200° C. for common resists used in liquid crystal and on the order of not higher than 250° C. for acrylic resins.

(3) The employment of photosensitive polyimide permits the curtailment of the process and cost reduction.

In one embodiment of the present invention, the plating film is a single layer film containing any one of the group consisting of Cu, Au, Ni and Ag or is a multi-layer film comprising at least one single layer film containing any one of the group consisting of Cu, Au, Ni and Ag.

In the metal interconnections of the above embodiment, Cu has a low resistance (bulk resistance of 1.7 $\mu\Omega\cdot$cm) and a long life against electromigration, and is most suitable as interconnecting material. Ag has the lowest resistance of those of all the metals and therefore the use of Ag for interconnections is highly advantageous. Au is highly resistant to corrosion and therefore prevents an oxidized film from being formed on its surface. This characteristic is highly advantageous for forming a plating film thereon. Au has a considerably low resistance, though higher than Cu, and, in electroplating, plays a role in reducing the resistance of the ground metal layer. In the employment of electroless selective plating as plating technique, the interconnecting lines with a satisfactory adhesion and a low resistance can be obtained by the use of Ni with a satisfactory adhesion as the ground and the deposition thereon of Cu/Au or the like, even though the adhesion property of simple substance of Cu is low. In addition, a barrier layer can be formed by the selective formation of Ni on Cu with plating.

In one embodiment of the present invention, the plating is electroless plating.

In accordance with the metal interconnections of the above embodiment, electroless selective plating allows the formation of the metal interconnections even if the ground is made of such an electrically nonconducting material as polyimide. Even with a glass having a large area, a simple equipment can be used because the uniformity of the film thickness in the surface is considerably satisfactory and electricity is not conducted.

Also, there is provided an active matrix substrate using the metal interconnections of the present invention.

In accordance with the aforementioned active matrix substrate, an active matrix substrate with a high yield and a high reliability can be obtained by using the metal interconnections for an active matrix substrate in which a pattern is formed on the interconnecting lines or on the intersections of these interconnecting lines in the majority of cases and reverse taper of both sides of the metal lines would cause such problems as breaks of the film and a remaining film.

In one embodiment of the present invention, the taper angle α which both sides of the plating film form with the surface of the glass substrate is in the range of $20°\leq\alpha\leq75°$.

In accordance with the active matrix substrate of the above embodiment, the taper angle which both sides of the plating film form with the surface of the glass substrate is not less than 20°. This eliminates the possibility that too small taper angle might cause too large widths of the tapered portions and that the whole width of the interconnecting lines might be occupied by the tapered portions. On the other hand, with the taper angle which both sides of the plating film form with the surface of the glass substrate not greater than 75°, the occurrence of a step-wise disconnection and the like can be prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a diagram illustrating the details of the method of making the metal interconnections;

DETAILED DESCRIPTION OF THE PREFERRED EMBODIMENTS

Hereinbelow, metal interconnections according to the invention and an active matrix substrate using the same will be described in detail with reference to embodiments illustrated in the appended drawings. The embodiments will be described on the assumption that the metal interconnections and the active matrix substrate using the same according to the invention are applied to a LCD driven by an active matrix.

(First Embodiment)

Figure 1:
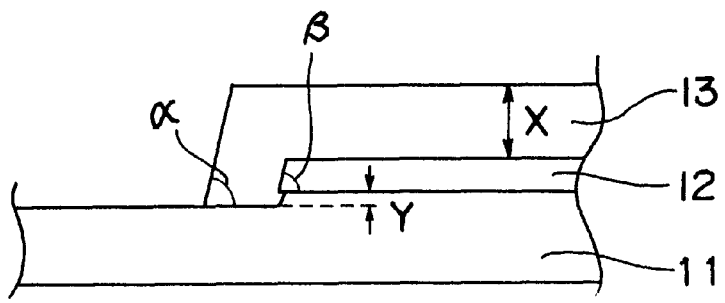
FIG. 1 is a schematic sectional view of metal interconnections according to a first embodiment of the invention.

FIG. 1 is a schematic sectional view of metal interconnections according to a first embodiment of the invention. A reference numeral 11 denotes a glass substrate. A numeral 12 denotes a ground pattern film for interconnections formed on the glass substrate 11. A numeral 13 denotes a plating film formed by plating the ground pattern film 12. In FIG. 1, α is a taper angle of both sides of the metal lines (the plating film 13). β is a taper angle of both sides of the ground pattern film 12. X is a film thickness of the plating film 13. Y is a digging quantity of glass.

In the metal interconnections with the above arrangement, the taper angle α of the plating film 13 is in the range of $0<\alpha\leq90°$. The taper angle β of the ground pattern film 12 is in the range of $0<\beta\leq90°$. The film thickness X of the plating film 13 is in the range of $Y\leq X\leq8000$ Å. The digging quantity Y of glass of the glass substrate 11 is in the range of $0\leq Y\leq2000$ Å.

Figure 2A:
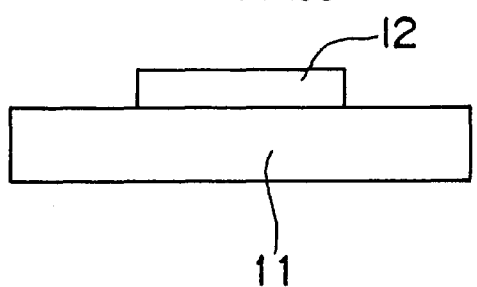
FIGS. 2A and 2B are views illustrating a method of making the metal interconnections.
Figure 2B:
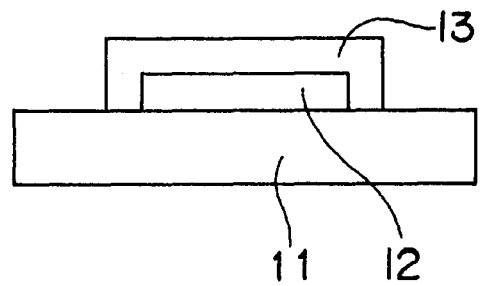

FIGS. 2A and 2B illustrate a method of making the metal interconnections. Hereinafter, the method of making the metal interconnections will be described with reference to FIGS. 2A and 2B.

(First Process)

Initially, the surface of the glass substrate 11 manufactured by Corning Inc. (#1737) is degreased and cleaned with use of alkali, acid or organic solvent. At this time, simultaneous use of ultrasonic makes the cleaning more effective. In place of the glass substrate 11, the following may be used:
  (i) an inorganic substrate such as glass, ceramic, and a semiconductor or conductor substrate that is provided with an insulating layer on its surface
  (ii) an organic substrate or film of PET (polyethylene terephthalate), ABS (acrylonitrile-butadiene-styrene copolymer), PC (polycarbonate), PES (polyether sulfone) or the like ITO film (or $SnO_2$ film) 12 as the ground pattern film is then formed on the glass substrate 11 with sputtering.

In the first process, the ITO film (or SnO$_2$ film) may be produced with dry deposition; however, the ground pattern film can be formed with wet deposition (e.g., coating, sol-gel processing, liquid growth, electrodeposition, spraying, and chemical mist deposition (CMD)).

In the case that the ITO film or SnO$_2$ film is deposited with sol-gel processing of wet deposition, for example, photosensitive material may be used. The use of photosensitive material eliminates the use of resist and the etching process for resist, and permits cost reduction and the curtailment of the process.

As the ground pattern film, a transparent conductive film patterned with ZnO or In$_2$O$_3$, and the like may be used as well as ITO or SnO$_2$, on condition that there is no problem concerning its chemical resistance.

Besides, it is conceivable that the ground pattern film may be formed of resin such as polyimide in place of ITO or SnO$_2$. Photosensitive polyimide may be used, and the use of that has advantages, e.g., of permitting cost reduction and the curtailment of the process. Thus it is highly advantageous to use polyimide; however, the resin being utilized as resist other than polyimide, i.e., novolak resin, acrylic resin, epoxy resin used for printed wiring boards, or the like may be used on condition that it would be usable, e.g., with the lowering in the processing temperature and the adequate selection of chemicals.

The thickness of the ground pattern film is not defined in the invention; however, it is preferably reduced in the case that the film is used, e.g., with an active matrix substrate. That is, the reduction in the thickness of the ground pattern film allows the reduction in the whole thickness of the metal lines, and thus decreases the degree of the convexity or concavity caused by the pattern on the glass substrate. Accordingly, the thickness of the ITO film in the first embodiment is set at 1000 Å.

The ITO film is then exposed to light, subjected to a development process and, subsequently, patterned in the geometry of the interconnections by etching process, which results in the formation of the ground pattern film 12. Specifically, a resist film is initially coated on the ground ITO film, then exposed to light with use of a photo mask, and then patterned with the aid of alkali development. After that, the ITO film is etched with use of the resist pattern and, finally, the resist is exfoliated.

The ground pattern film with photosensitivity that can be patterned by exposure to light and development is most preferable in terms of cost-reduction and the simplification of the process, because such a film can be patterned with a photo-process alone.

(Second Process)

A film is deposited on the ground pattern film 12 with electroless selective plating.

Specifically, FIG. 3 illustrates the steps of the method of manufacturing the metal interconnections, which steps will be described in detail hereinbelow with reference to FIG. 3.

Between each step A to H (except for the meantime after an annealing step E), washing with water is performed for washing process-liquid away; however, the reference to the washing treatment is made in the section of the step A alone and is omitted in the sections of the other steps, because the same treatment is performed on each occasion.

[Step A]

Initially, the dirt on the surface of the glass substrate 11 (shown in FIG. 2B) and on the surface of the ground pattern film 12 (shown in FIG. 2B) comprising ITO is eliminated by degreasing and cleaning the surface of the substrate. The degreasing and cleaning, with use of Melcleaner ITO-170 made by Meltex Inc., is performed for five minutes at 75° C. (ultrasonic wave is employed simultaneously). For washing the liquid away, washing is subsequently conducted twice with use of pure water. The first and second washing are both performed for approximately five minutes at room temperature.

[Step B]

The process for etching the ITO surface to some extent is performed to activate Sn contained in ITO of the ground pattern film 12 and to improve the adhesion of plating film to ITO. The etching process, with use of Melplate Conditioner 478 made by Meltex Inc., is performed for five minutes at room temperature.

The surface of the glass substrate 11 is etched in the step B by the action of hydrofluoric acid contained in Melplate Conditioner 478. The digging quantity of glass can be varied by the variations in the concentration of Melplate Conditioner 478. In this process, the concentration of Melplate Conditioner 478 is controlled so as to achieve the digging quantity of glass in the range of 0 to 2000 Å.

[Step C]

With the aid of activated Sn, Pd catalyst is made adhere to the ground pattern film 12 (shown in FIG. 2B) comprising ITO. For this purpose, the process is conducted in Enplate Activator 440 made by Meltex Inc., for five minutes at room temperature. This process causes Pd catalyst to adhere only to the surface of the ground pattern film 12 comprising ITO and permits selective plating.

This step C employs Pd as electroless plating catalyst; however, the following may be used instead of Pd: metal such as Ag, Pt, Zn, Cu and Ni; alloy thereof; metal compound thereof; alloy in which such metal(s) and other metal(s) are alloyed in a certain proportion; or the like.

[Step D]

The immersion in electroless Ni plating solution causes Ni coating to be deposited selectively on the ground pattern film 12 comprising ITO. This operation is intended for the growth of Ni in which aforementioned Pd catalyst functions as the nucleus. This electroless plating is performed at 70° C. with use of Melplate Ni-867 made by Meltex Inc. The film of an arbitrary thickness can be deposited by the variations in the period of the electroless plating process. The period is on the order of three to five minutes in this step.

[Step E]

Annealing process is performed to improve the adhesion of the electroless Ni plating film to the ITO film (the ground pattern film 12). This step E employs the annealing process because the adhesion improves when the process is performed; however, this process may be omitted if not necessary.

[Step F]

Degreasing process is performed again for the purpose of washing because the annealing process in the step E is done in the atmosphere. In the case that the annealing process is not done, this step may be omitted.

[Step G]

Substitution plating is executed in which deposition is achieved by the substitution of Au for Ni surface. The substitution plating is performed at 90° C. with use of Melplate AU-601 made by Meltex Inc. The plating is intended for the facilitation of Cu plating in the next step because Au is highly resistant to corrosion and resistant to surface oxidation.

The thickness of the Au plating film in the case that the next film will be made by electroplating is preferably on the order of 0.01 to 0.1 μm in terms of the necessity of a low resistance of the ground metal film. In the case that the next film will be made by electroless plating, the Au film may be made thinner because it is enough for the Au film to cover the surface to some extent. The Au film is preferably as thin as possible because Au is expensive and the increase in the film thickness raises the cost.

As the electroless plating solution, non-cyanide solution is more preferable than cyan-based solution, in terms of the influence on work environment and the like.

[Step H]

The Au/Ni/ITO film is selectively plated with Cu by the immersion of the substrate in electroless Cu plating solution. This Cu plating process is performed at 25° C. with use of Melplate Cu-390. The thickness of the Cu film can be arbitrarily varied by the variations in the period of the process. This step H employed formaldehyde and the like as plating solution; however, plating solution that does not contain these chemicals is more preferable in terms of the influence on environment. This step H employed electroless Cu plating; however, Cu electroplating may be employed because a film with lower resistance can be made. (In general, the resistance of an electroless plating film is higher than that of an electrolytic plating film.)

In this manner, a Cu/Au/Ni multi-layer film is formed as the plating film 13 on the ground pattern film 12 comprising ITO.

Hereinbelow, an experiment that derived the condition concerning a taper angle of these metal lines will be described.

Initially, an active matrix substrate was produced by forming metal interconnections without regard for the shape of its taper. When the next film was deposited on the substrate having metal interconnections with reverse taper, as mentioned before, the reversely tapered portions of both sides of the metal lines shadowed so that the film was not properly deposited and a plenty of breaks were made. Besides, dry etch that was employed for the patterning of the film was anisotropic etching, so that the edge portion of the shadow caused by the reverse taper was not etched and a remaining film occurred.

By contrast, the metal interconnections with the taper angle of not more than 90° at both sides, neither breaks nor leaves remaining film.

The following study was made on the condition which results in the taper angle of not more than 90°. Table 1 is the result of an experiment on the shapes of the taper in the case that various geometries of metal lines were formed with varying parameters of the etching quantity of glass (the digging quantity Y of glass) and of the thickness of plating film (the thickness X of plating film), in accordance with the aforementioned method of making metal interconnections.

TABLE 1

| Digging quantity Y of glass (Å) | Thickness X of plating film (Å) | | | | | | |
|---|---|---|---|---|---|---|---|
| | 500 | 1000 | 2000 | 4000 | 6000 | 8000 | 10000 |
| 0 | o | o | o | o | o | o | x |
| 500 | o | o | o | o | o | o | x |
| 1000 | x | o | o | o | o | o | x |
| 2000 | x | x | o | o | o | o | x |
| 3000 | x | x | x | x | x | x | x | o: depositable with satisfactory shape of taper
x: reversely tapered

In the result of the experiment shown in Table 1, with the digging quantity of glass being approximately zero angstrom, it was observed that the film thickness exceeding 8000 Å caused the reverse taper. This is because the difference in the growth rate of plating film causes reverse taper in its portions in intimate contact with glass as the film thickness exceeds a certain amount.

Besides, the event was observed that the digging quantity Y of glass exceeding 2000 Å caused the reverse taper. It has been understood that, with the digging quantity Y of glass exceeding 2000 Å, an area of glass underneath the ground pattern film is etched to form a shape like a huge umbrella. The umbrella with its size exceeding a certain degree (the umbrella with the digging quantity of glass on the order of 1000 Å makes a satisfactory shape of taper and can be plated) makes a faulty shape of taper.

In the case that the thickness X of the plating film is relatively small, it was observed that the smaller thickness X relative to a given digging quantity Y of glass caused the reverse taper. This stands to reason in terms of a characteristic of plating that the deposition is achieved along the ground pattern in the case that the film thickness is smaller than the digging quantity Y of glass.

From these results, it is confirmed that the digging quantity Y of glass in the range of $0 \leq Y \leq 2000$ Å and the thickness X of the plating film in the range of $Y \leq X \leq 8000$ Å cause the taper angle $\alpha$ of the metal lines to be in the range of $0 < \alpha \leq 90°$.

Figure 5A:
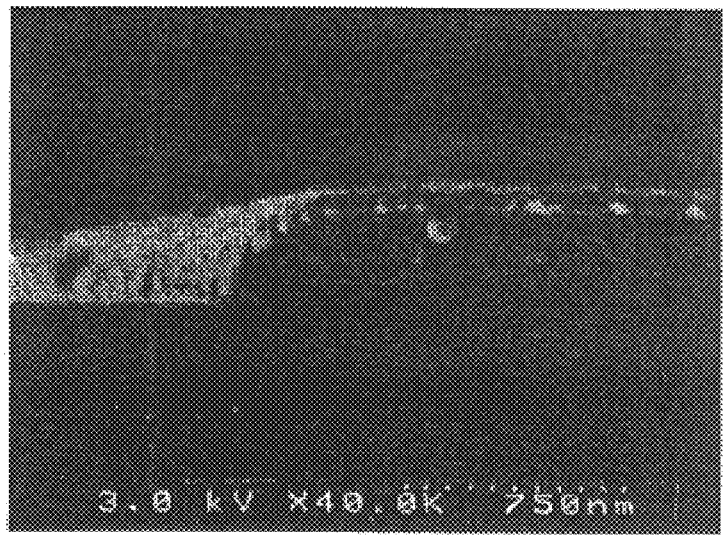
FIGS. 5A and 5B are microphotographs showing results of observation with SEM in the cases that the taper angle is not greater than 90°.
Figure 5B:
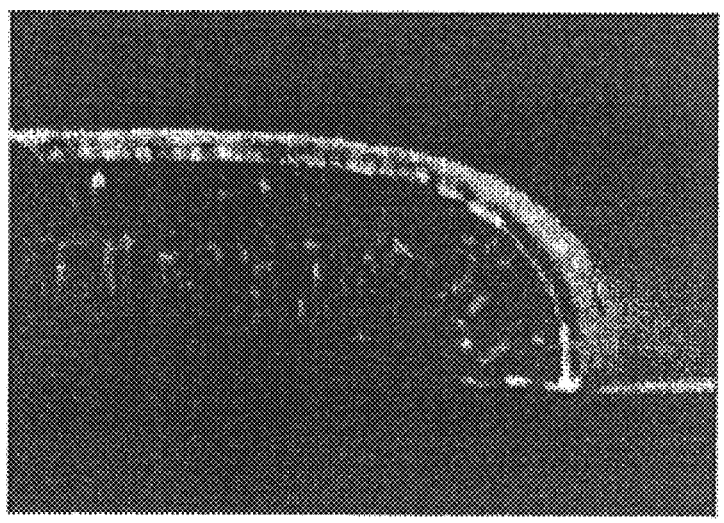
Figure 6A:
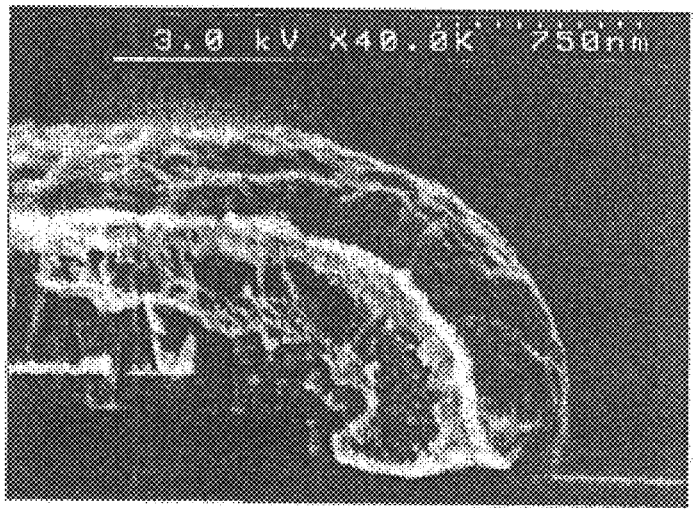
FIGS. 6A and 6B are microphotographs showing results of observation with SEM in the cases that the taper angle is greater than 90°.
Figure 6B:
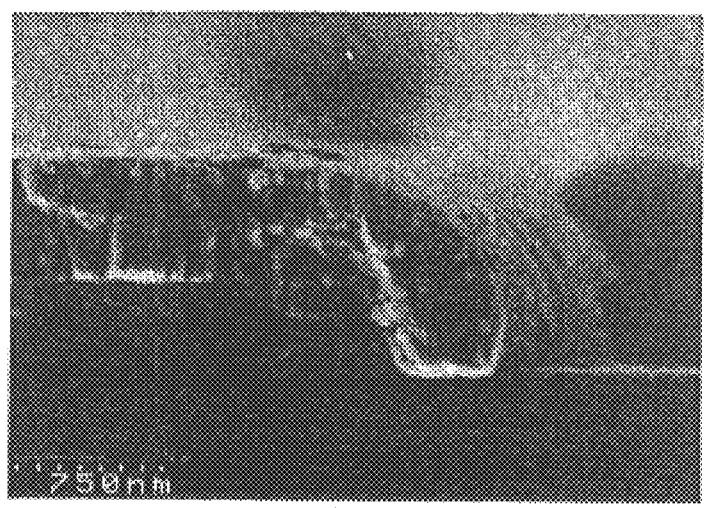

FIGS. 5 and 6 are typical results of the observation, with SEM (scanning electron microscope), of sections of the metal lines formed by the aforementioned method of producing metal interconnections. As shown in FIG. 5A, the taper angle $\alpha$ was not greater than 90° with the digging quantity of glass of about 750 Å and the thickness of the plating film of 2250 Å. As shown in FIG. 5B, the taper angle $\alpha$ was not greater than 90° with the digging quantity of glass of about 1800 Å and the thickness of the plating film of about 5500 Å. As shown in FIG. 6A, the taper angle $\alpha$ exceeded 90° with the digging quantity of glass of about 2250 Å and the thickness of the plating film of about 10000 Å. As shown in FIG. 6B, the taper angle $\alpha$ exceeded 90° with the digging quantity of glass of about 2100 Å and the thickness of the plating film of about 4500 Å.

The first embodiment has been described with reference to the laminated structure of Cu/Au/Ni/ITO; however, various film structures such as Cu/Ni/ITO, Cu/ITO, Ni/ITO and Ni/Cu/ITO are conceivable.

Figure 4A:
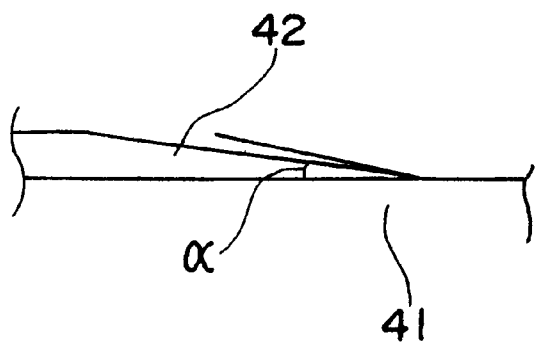
FIG. 4A is a view illustrating a minimal taper angle and FIG. 4B is a view illustrating a maximal taper angle.
Figure 4B:
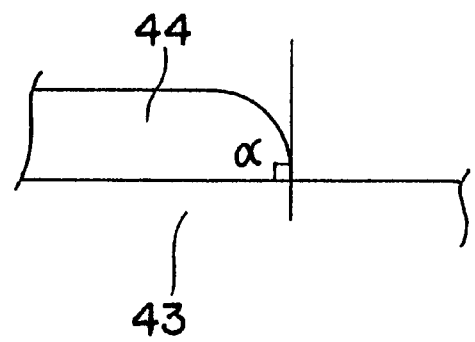

As a result, upon the formation of new metal lines on the aforementioned metal lines, the shape of taper of both sides of the metal lines permits the new metal lines to be formed without a break. Upon the patterning of a new film on the metal lines, the shape of taper of both sides of the metal lines prevents remaining film that would be caused by faulty etching. In the first embodiment, the taper angle $\alpha$ which both sides of the plating film of the metal interconnections form with the surface of the glass substrate is in the range of $0 < \alpha \leq 90°$. The reason why the maximum of the taper angle $\alpha$ is 90° is as follows. As shown in FIG. 4B, upon the formation and patterning of a new film on a plating film 44 formed on a glass substrate 43, breaks and remaining film can be prevented providing that reverse taper is avoided at least. The reason why the taper angle $\alpha$ is greater than 0° is as follows. As shown in FIG. 4A, breaks and remaining film can be prevented providing that both sides of a plating film 42 produced on a glass substrate 41 form an angle greater than the taper angle that is infinitesimally close to zero.

The plating film 13 with the taper angle $\alpha$ in the range of $0 < \alpha \leq 90°$ can be reliably formed without making the taper of both the sides reversed, with the arrangement in which the taper angle $\beta$ formed by both sides of the ground pattern film 12 with the surface of the glass substrate 11 is in the range of $0<\beta \leq 90°$, the digging quantity Y of the glass substrate 11 in the area that is not covered with the ground pattern film 12 is in the range of $0 \leq Y \leq 2000$ Å and the thickness X of the plating film 13 is in the range of $Y \leq X \leq 8000$ Å.

A margin for the manufacturing process can be raised by using, for the ground pattern film, ITO which is highly resistant to the chemicals used in the manufacturing process of active matrix substrates or $SnO_2$ which is highly resistant to common chemicals. In the case that the ITO or $SnO_2$ film is deposited with sol-gel processing of wet deposition, the employment of photosensitive material eliminates the use of resist and therefore results in cost reduction and the curtailment of the process. In the application of these metal interconnections to an active matrix substrate, using a transparent conductive film of ITO or $SnO_2$ for the ground pattern film allows the simultaneous formation of the ground pattern film of the metal interconnections and pixel electrodes, and plating only the area of the interconnecting lines allows the simultaneous formation of the interconnecting lines and pixel electrodes.

In the employment of electroless selective plating as the plating technique, using polyimide, which is highly resistant to heat and chemicals, for the ground pattern film permits a method of manufacturing in posterior process to be selected from a wide variety of options. Besides, polyimide is so resistant to heat that the margins of other deposition processes widen and the absence of the necessity of low temperature in the processes prevents the failure associated with low temperature. In addition, the employment of photosensitive polyimide permits the curtailment of the process and cost reduction.

In the plating film 13 that is Cu/Au/Ni multi-layer film, a film of Au that is highly resistant to corrosion and resistant to surface oxidation is deposited on Ni that has a satisfactory adhesion property and is used as the ground, and a film of Cu is deposited thereon that has a low resistance (bulk resistance of 1.7 $\mu\Omega$·cm) and a long life against electromigration. With this arrangement, the metal interconnections with a satisfactory adhesion property, high reliability and a low resistance can be obtained.

In these metal interconnections used for an active matrix substrate, the width of the interconnecting lines of 10 $\mu$m, the film thickness of the interconnecting lines of 5000 Å and the taper angle of 30° would cause the total of the widths of tapered portions at the left and right to be 2 $\mu$m. From such a viewpoint, too small taper angle might cause too large widths of tapered portions and the whole width of the interconnecting lines might be occupied by the tapered portions. In consequence, the minimal angle is preferably not less than 20°. The maximal taper angle considered to be preferable is not greater than 75° or so in terms of the possibility of step-wise disconnections and the like. In the metal interconnections used for an active matrix substrate, therefore, the taper angle $\alpha$ is preferably in the range of $20° \leq \alpha \leq 75°$.

(Second Embodiment)

Figure 7:
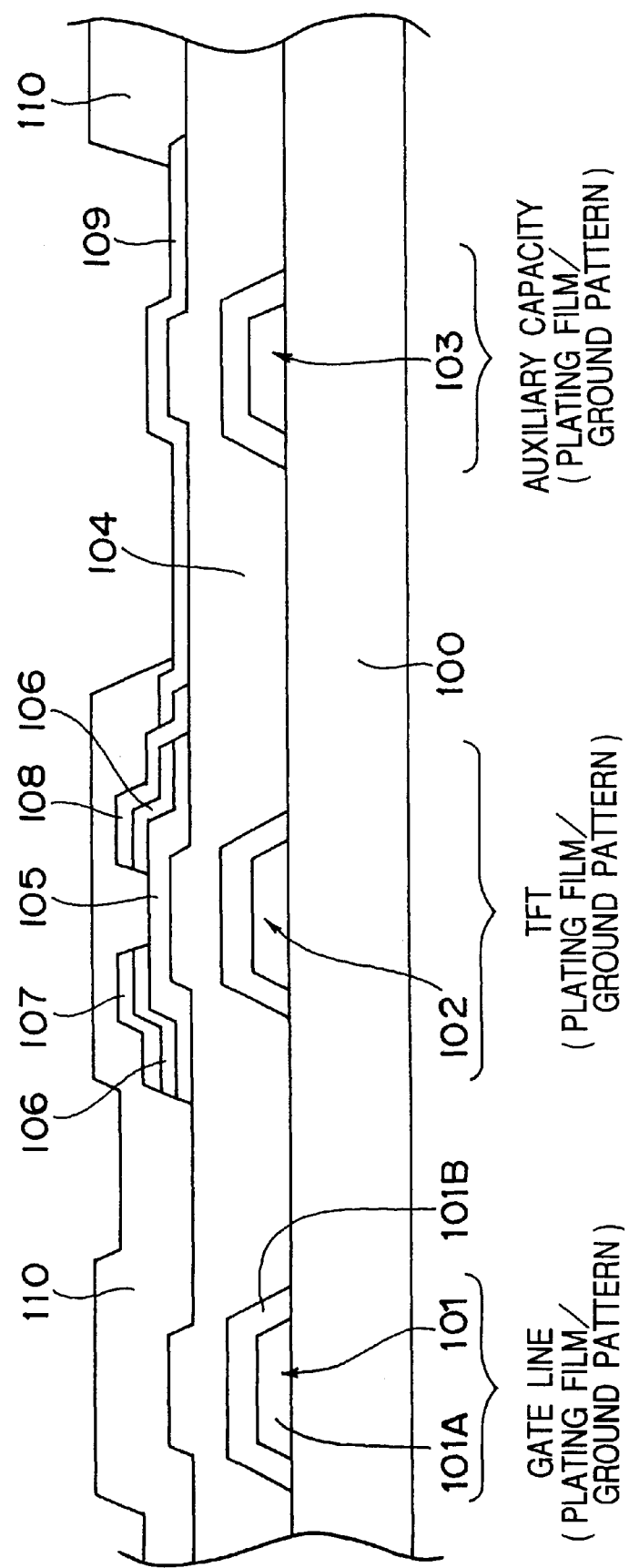
FIG. 7 is a sectional view of a major part of an active matrix substrate using metal interconnections according to a second embodiment of the invention.
Figure 8:
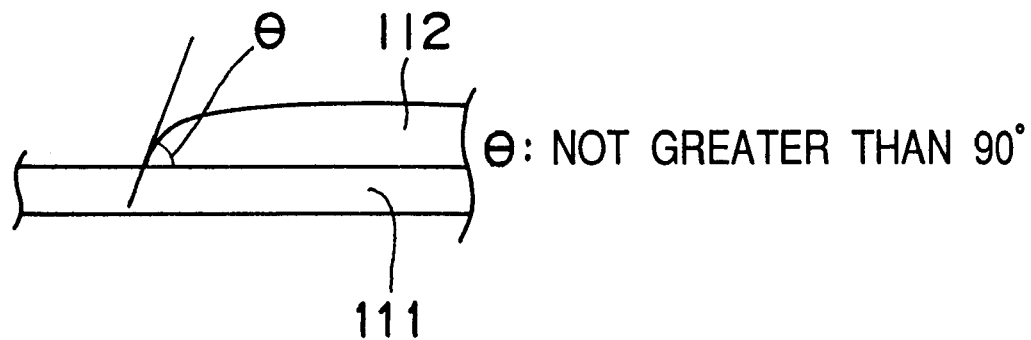
FIG. 8 is a view illustrating metal interconnections with a taper angle not greater than 90°.
Figure 9:
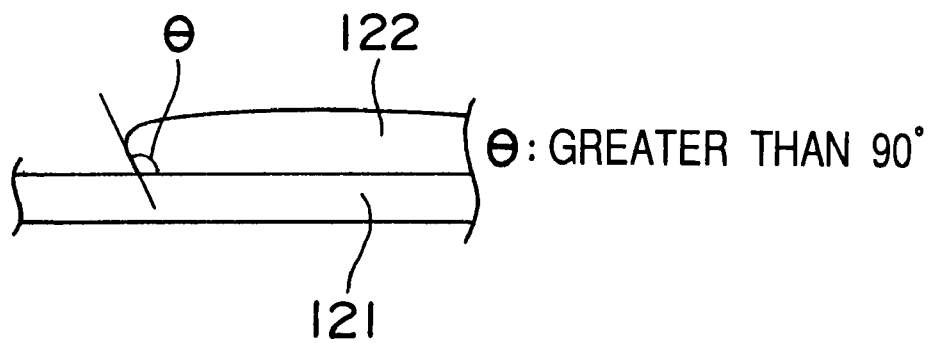
FIG. 9 is a view illustrating reversely tapered metal interconnections with a taper angle greater than 90°.
Figure 10:
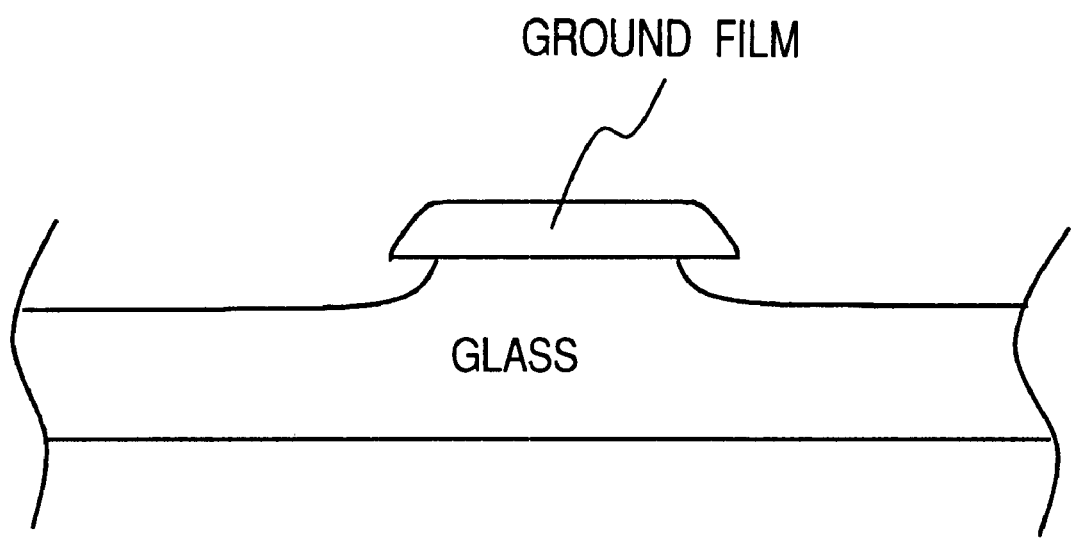
FIG. 10 is a view illustrating a situation in which a ground film has been etched to form a shape like an umbrella.

FIG. 7 is a section of a thin-film transistor and its periphery in which metal interconnections according to a second embodiment of the invention is used on an active matrix substrate, with the employment of the metal interconnections obtained from the first embodiment.

As shown in FIG. 7, on a glass substrate 100 are formed gate line 101, a gate electrode 102 connected to the gate line 101, and an electrode 103 for auxiliary capacity. The gate line 101 comprises an ITO film 101A (with a thickness of 1000 Å) formed as a ground pattern film and a Cu/Au/Ni film 101B (with a total thickness of 2000 Å) formed as a plating film on the ITO film 101A. Similarly, the gate electrode 102 and the electrode 103 for auxiliary capacity also comprise an ITO film as a ground pattern film and a Cu/Au/Ni film as a plating film.

A gate insulating film 104 comprising $SiN_x$ is formed with CVD (chemical vapor deposition) method on the whole surface of the substrate on which the gate line 101, the gate electrode 102 and the electrode 103 for auxiliary capacity are formed. On the gate insulating film 104 corresponding to the gate electrode 102 are formed a-Si film as a channel 105, a-Si film of $n^+$ type as a contact layer 106, a source electrode 107 comprising Mo and the like, and a drain electrode 108, and a TFT is thereby constituted. There are also formed a pixel electrode 109 that is connected to the drain electrode 108 and comprises ITO, and an insulative protection film 110 that comprises $SiN_x$. The pixel electrode 109 and the electrode 103 for auxiliary capacity with an interposition of the gate insulating film 104 therebetween configure an auxiliary capacity.

It has been confirmed that the TFT obtained in this way can be made without a break, pattern failure and the like and the metal interconnections of the invention can be applied to an active matrix substrate. The application of the metal interconnections of the invention to an active matrix substrate therefore results in the obtainment of the active matrix substrate that is characterized by the elimination of breaks and remaining film, i.e., by a high yield and high reliability.

The second embodiment has been described with reference to the active matrix substrate having the TFTs with a reverse stagger structure; however, the invention may be applied to an active matrix substrate having TFTs with a stagger structure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Metal interconnections which are formed on a glass substrate and comprise a ground pattern film for interconnecting lines, and a plating film having a thickness (X) and being formed by selective plating on the ground pattern film, wherein a digging quantity (Y) of the glass substrate is defined as an area that is not covered with the ground pattern film, the metal interconnections being characterized in that a taper angle $\alpha$, which both sides of the plating film form with the surface of the glass substrate, is in the range of $0 \leq \alpha \leq 90°$, and in that the thickness (X) of the plating film is greater than the digging quantity (Y) of the glass substrate.

2. The metal interconnections, as claimed in claim 1, wherein a taper angle $\beta$, which both sides of the ground pattern film form with the surface of the glass substrate, is in the range of $0 \leq \beta \leq 90°$, and wherein the digging quantity (Y) of the glass substrate is in the range of $0 \leq Y \leq 2000$ Å A and the thickness (X) of the plating film is in the range of $X \leq 8000$ Å.

3. The metal interconnections, as claimed in claim 1, wherein the ground pattern film comprises ITO or $SnO_2$.

4. The metal interconnections, as claimed in claim 1, wherein the ground pattern film comprises polyimide.

5. The metal interconnections, as claimed in claim 1, wherein the plating film is a single layer film containing any one of the group consisting of Cu, Au, Ni and Ag or is a multi-layer film comprising at least one single layer film containing any one of the group consisting of Cu, Au, Ni and Ag.

6. The metal interconnections, as claimed in claim 1, wherein the plating is electroless plating.

7. An active matrix substrate using the metal interconnections as claimed in claim 1.

8. The active matrix substrate, as claimed in claim 7, wherein the taper angle $\alpha$, which both sides of the plating film form with the surface of the glass substrate, is in the range of $20° \leq \alpha \leq 75°$.

* * * * *

UNITED STATES PATENT AND TRADEMARK OFFICE
CERTIFICATE OF CORRECTION

PATENT NO.     : 6,518,676 B2
DATED          : February 11, 2003
INVENTOR(S)    : Y. Chikama et al.

It is certified that error appears in the above-identified patent and that said Letters Patent is hereby corrected as shown below:

<u>Title page,</u>
Item [30], Foreign Application Priority Data, 2nd Foreign Priority Application should read:  -- May 25, 2000 JP 2000-155005 --

Signed and Sealed this

Twenty-fourth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,518,676 B2
DATED : February 11, 2003
INVENTOR(S) : Y. Chikama et al.

It is certified that error appears in the above-identified patent and that said Letters Patent is hereby corrected as shown below:

<u>Title page,</u>
Item [56], References Cited, FOREIGN PATENT DOCUMENTS, should read:
-- (TW) 420853 02/01/01 --.

Signed and Sealed this

Seventeenth Day of January, 2006

JON W. DUDAS
*Director of the United States Patent and Trademark Office*